(12) United States Patent
Boemler

(10) Patent No.: US 11,006,058 B2
(45) Date of Patent: May 11, 2021

(54) PUMPED LARGE FULL WELL PIXEL

(71) Applicant: RAYTHEON COMPANY, Waltham, MA (US)

(72) Inventor: Christian M. Boemler, Goleta, CA (US)

(73) Assignee: RAYTHEON COMPANY, Waltham, MA (US)

( * ) Notice: Subject to any disclaimer, the term of this patent is extended or adjusted under 35 U.S.C. 154(b) by 39 days.

(21) Appl. No.: 16/592,051

(22) Filed: Oct. 3, 2019

(65) Prior Publication Data

US 2020/0112698 A1 Apr. 9, 2020

Related U.S. Application Data

(60) Provisional application No. 62/741,217, filed on Oct. 4, 2018.

(51) Int. Cl.
| | | |
|---|---|---|
| *H04N 5/355* | (2011.01) | |
| *H01L 27/146* | (2006.01) | |
| *H04N 5/3745* | (2011.01) | |
| *H04N 5/378* | (2011.01) | |

(52) U.S. Cl.
CPC ..... *H04N 5/3559* (2013.01); *H01L 27/14612* (2013.01); *H01L 27/14643* (2013.01); *H04N 5/378* (2013.01); *H04N 5/3745* (2013.01)

(58) Field of Classification Search
CPC .... H04N 5/3559; H04N 5/3745; H04N 5/378; H01L 27/14612; H01L 27/14643
See application file for complete search history.

(56) References Cited

U.S. PATENT DOCUMENTS

| | | | |
|---|---|---|---|
| 6,873,359 B1 | 3/2005 | Kozlowski et al. | |
| 9,621,829 B1* | 4/2017 | Boemler | H04N 5/3745 |
| 9,674,471 B1* | 6/2017 | Boemler | H04N 5/37455 |
| 10,187,597 B2* | 1/2019 | Yang | H04N 5/378 |
| 10,715,728 B1* | 7/2020 | Ragucci | H04N 5/357 |
| 2013/0278804 A1* | 10/2013 | Denham | H04N 5/347 |
| | | | 348/302 |
| 2020/0066781 A1* | 2/2020 | Beuville | H04N 5/365 |

(Continued)

FOREIGN PATENT DOCUMENTS

WO 2018118016 A1 6/2018

OTHER PUBLICATIONS

Notification of Transmittal of the International Search Report of the International Searching Authority, or the Declaration; PCT/US2019/054203; dated Dec. 5, 2019, 5 pages.

(Continued)

*Primary Examiner* — Shahbaz Nazrul
(74) *Attorney, Agent, or Firm* — Cantor Colburn LLP

(57) ABSTRACT

A pixel includes an integration capacitor coupled between a system voltage and a pump voltage source and having a first side and a second side. The pixel can be operated to have a large full well by: storing charge from a photo-current source in the integration capacitor; reading out the integration capacitor; resetting the integration capacitor by connecting the capacitor to a column line through a select transistor; while resetting, setting the pump voltage source to the system voltage; and after resetting, setting the pump voltage to ground to create a negative voltage between the integration capacitor and column line.

18 Claims, 3 Drawing Sheets

(56) References Cited

U.S. PATENT DOCUMENTS

2020/0111826 A1* 4/2020 Boemler ................. H04N 5/355
2020/0169675 A1* 5/2020 Stobie .................... H04N 5/378
2020/0169681 A1* 5/2020 Stobie ..................... H04N 5/05
2020/0382732 A1* 12/2020 Malone .............. H04N 5/37455

OTHER PUBLICATIONS

Notification of Transmittal of the International Written Opinion of the International Searching Authority, or the Declaration; PCT/US2019/054203; dated Dec. 5, 2019, 7 pages.

* cited by examiner

PUMPED LARGE FULL WELL PIXEL

CROSS-REFERENCE TO RELATED APPLICATIONS

This application claims the benefit of U.S. Provisional Application Ser. No. 62/741,217, filed Oct. 4, 2018, which is incorporated herein by reference in its entirety.

BACKGROUND

The present disclosure relates to a digital pixel imager and, in particular, a digital pixel circuit that includes two bloom storage capacitors.

In legacy analog imagers, particularly infrared imagers, photo-current from a detector diode is integrated by a well capacitor coupled to the detector diode, and then once per video frame, the voltage or charge of each well capacitor is transferred to a down-stream analog-to-digital converter (ADC), where the voltage is converted to a binary value. Pixel sizes continue to shrink and the ratio of well capacitor to pixel area shrinks disproportionately more. Simultaneously, there is a demand by consumers for increased Signal-to-Noise Ratio (SNR) which can be realized by increasing effective well capacitance.

In-pixel ADC imagers are used to address this problem associated with decreasing pixel size. In particular, in-pixel ADC imaging improves photo-charge capacity for infrared imaging and other applications as the size of pixels continues to decrease. A good in-pixel ADC design can store nearly all of the available photo-charge from a detector diode and thus improve SNR to near theoretical limits. A common method of integration for in-pixel ADC circuits uses a quantizing analog front end circuit which accumulates charge over a relatively small capacitor, trips a threshold and is then reset. This pattern is repeated as more photo-current integrates.

An example of an in-pixel ADC circuit 100 is illustrated in FIG. 1. Charge from a photo-diode 110 is accumulated over an integration capacitor 115. Charge is accumulated, in general, until a readout time. When that time is reached, the charge stored in integration capacitor 115 is provided through a select transistor 125 switch to a column line 118.

Control of the flow of current from the photo-diode 110 is controlled by an injection transistor 112. The gate of the injection transistor 112 is coupled to a bias voltage Vbias. The level of this voltage can be selected by the skilled artisan and is used, in part, to keep the photo-diode in reverse bias where the voltage at node 114 is lower than the diode supply voltage Vdiode.

The integration capacitor 115 is connected to a readout circuit 120 via a column line 118. During a readout time for the particular diode 110, a select transistor 125 is provided a selection signal (Sel) that allows it to couple the integration capacitor 115 to the column line. Charge accumulated on the integration capacitor 115 is then read out by the readout circuit 120.

As shown the readout circuit 120 is capacitive transimpedance amplifier (CTIA) readout circuit that includes an amplifier 122 having an output (Vout), a capacitor 124 coupled between a one input of the amplifier 122 and the output of the amplifier (Vout) and a reset switch 126 coupled in parallel with the capacitor 124. Operation of such a circuit is well known and not discussed further in detail herein.

After readout of the integration capacitor 115 is completed, the circuit is reset via a reset switch 130 that receives a control signal Reset.

The above described circuit works well for its intended purpose.

At present, market demands drive smaller and smaller pixels while maintaining performance. However, as pixels shrink, so does the amount of charge an individual pixel (e.g, the combination of photo-diode 110 and integration capacitor 115) can hold. The amount of charge is also referred to as "full well" and is limited because as the capacitance shrinks, so does the full well (number of carriers=voltage swing*capacitance/q). A few solutions have been proposed and include: larger pixels; lower full well sizes and the implementation of a digital pixel that fold a larger voltage swing into a supply voltage range while counting the number of folds.

SUMMARY

According to one embodiment an integration network for connection to a photo-current source is disclosed. The network includes: an input; an output; a pump voltage source that provides at least two discreet voltage levels including a high voltage level and a low voltage level; an injection transistor coupled the input; a select transistor coupled to the output; and an integration capacitor coupled between the injection transistor and the pump voltage source, The integration capacitor has a first side and second side, the first side defining an integration node and being coupled to the output through the select transistor and the second side being coupled to the pump voltage source. During a reset the integration capacitor is connected to the output through select transistor while the pump voltage source is at the high voltage level, and after the reset, the pump voltage source is at the low level voltage and the integration capacitor disconnected from the output such that a voltage at the integration node is at a negative value.

In a network of any prior embodiment, the network further includes: an injection cascode transistor coupled between the injection transistor and the integration node; and a select cascode transistor coupled in series with the select transistor and between the integration node and the output.

In a network of any prior embodiment, the select cascode transistor is coupled between the integration node and the select transistor.

In a network of any prior embodiment, a gate of the injection cascode transistor is connected to ground and a gate of the select cascode transistor is connected to ground.

In a network of any prior embodiment, the injection transistor, the injection cascode transistor, the select transistor and the select cascode transistor are PMOS transistors.

In a network of any prior embodiment, the network can be combined with in combination with a photo-diode connected between the input and a diode voltage (Vdiode).

In a network of any prior embodiment, the high level is equal to Vdiode.

In one embodiment, a pixel is disclosed. The pixel includes: a photo-current source; a readout circuit; and an integration network. The network can be any network disclosed above. In one particular embodiment, the network includes: an input connected to the photo-current source; an output connected to the readout circuit; a pump voltage source that provides at least two discreet voltage levels including a high voltage level and a low voltage level; an injection transistor coupled the input; a select transistor coupled to the output; and an integration capacitor coupled between the injection transistor and the pump voltage source. The integration capacitor has a first side and second side, the first side defining an integration node and being coupled to the output through the select transistor and the second side being coupled to the pump voltage source. During a reset the integration capacitor is connected to the output through select transistor while the pump voltage source is at the high voltage level, and after the reset, the pump voltage source is at the low level voltage and the integration capacitor disconnected from the output such that a voltage at the integration node is at a negative value.

In a pixel of any prior embodiment, the readout circuit is a capacitive transimpedance amplifier (CTIA) readout circuit.

In a pixel of any prior embodiment, the network further includes: an injection cascode transistor coupled between the injection transistor and the integration node; and a select cascode transistor coupled in series with the select transistor and between the integration node and the output.

In a pixel of any prior embodiment, the select cascode transistor is coupled between the integration node and the select transistor.

In a pixel of any prior embodiment, a gate of the injection cascode transistor is connected to ground and a gate of the select cascode transistor is connected to ground.

In a pixel of any prior embodiment, the injection transistor, the injection cascode transistor, the select transistor and the select cascode transistor are PMOS transistors.

In a pixel of any prior embodiment the photo-current source is a photo-diode connected between the input and a diode voltage (Vdiode) and wherein the high voltage level is equal to Vdiode.

In one embodiment, a method of operating a pixel, the pixel comprising an integration capacitor coupled between a system voltage and a pump voltage source and having a first side and a second side is disclosed. The method includes: storing charge from a photo-current source in the integration capacitor; reading out the integration capacitor; resetting the integration capacitor by connecting the capacitor to a column line through a select transistor; while resetting, setting the pump voltage source to the system voltage; after resetting, setting the pump voltage to ground to create a negative voltage between the integration capacitor and column line.

In a method of any prior embodiment, resetting includes connecting the integration capacitor to the column line select cascode transistor coupled in series with the select transistor and between the integration node and the output.

In a method of any prior embodiment, the method further includes: after resetting, connecting the integration capacitor to the photo-current source through an injection cascode transistor coupled in series with an injection transistor, wherein the injection transistor is coupled to the photocurrent source.

In a method of any prior embodiment the injection transistor, the injection cascode transistor, the select transistor and the select cascode transistor are PMOS transistors.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
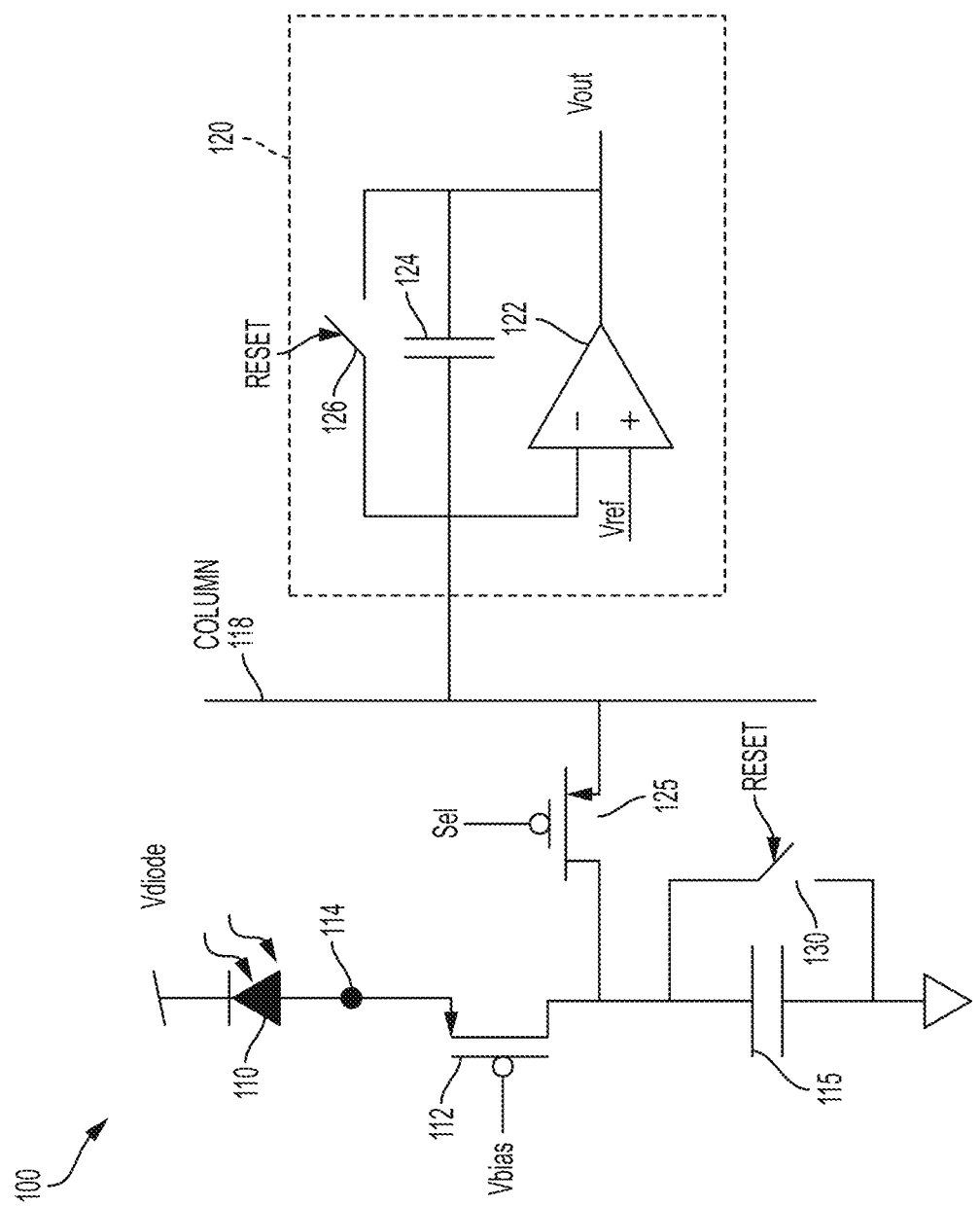
FIG. 1 is a schematic diagram illustrating a prior art column level pixel integration and readout circuit.
Figure 2:
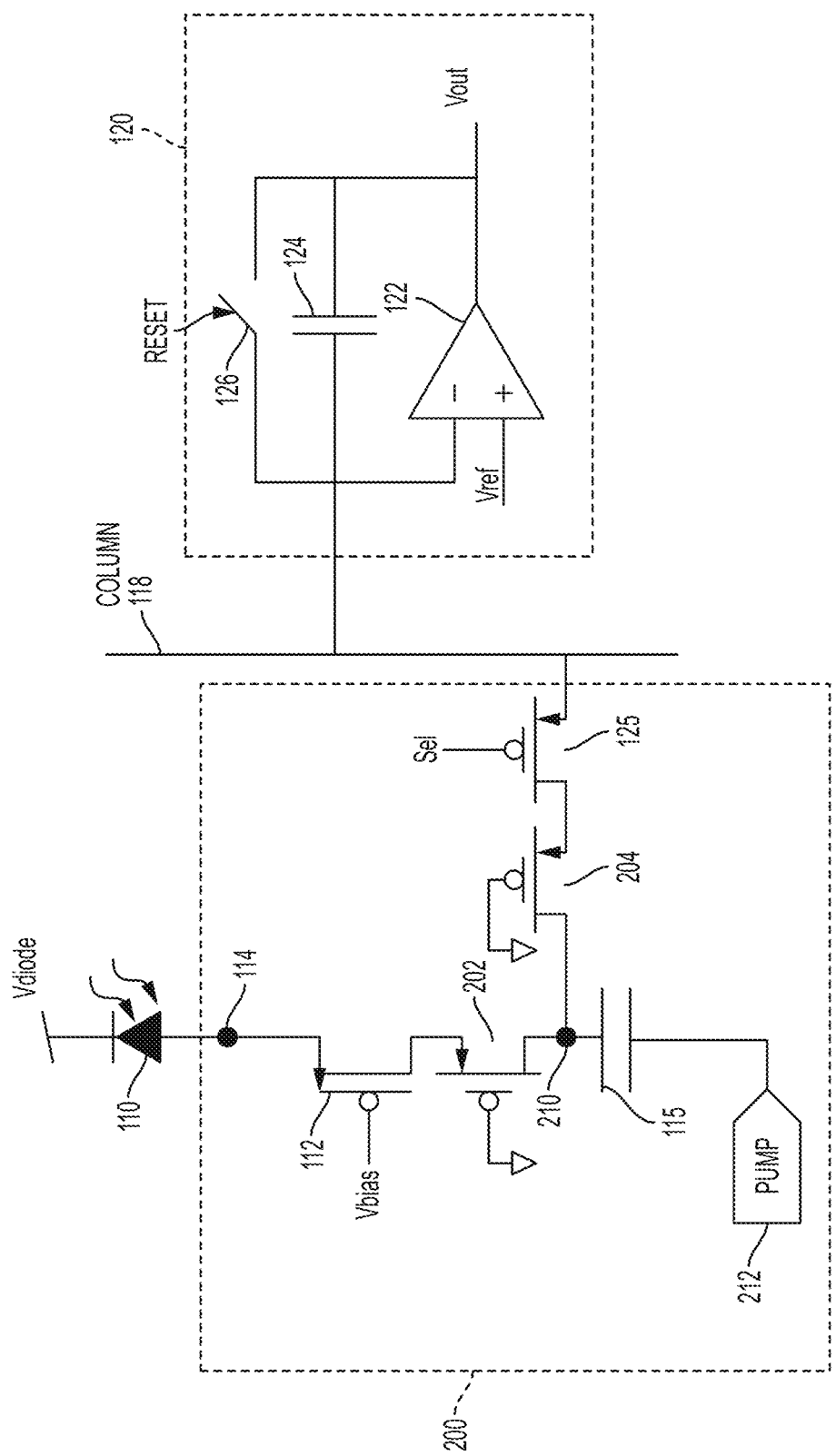
FIG. 2 is pumped pixel integration and readout circuit according to one embodiment.

FIG. 2 shows one embodiment of an integration network 200 for a pixel according to one embodiment. The network 200 is connected to a CTIA readout circuit 120 that operates in general, to ready out charge stored in an integration capacitor 115 when the network 200 is connected to the column line 118 through column select transistor 125. The CTIA readout circuit 120 is known in the art and not discussed further herein.

As discussed above, increasing the full well potential of a pixel can be advantageous. A pixel including the all PMOS transistors is disclosed that can achieve a larger full well. Similar to the above, the network 200 is connected to photo-diode 100 and includes a direct injection transistor 112, a select transistor 125. The network 200 also includes an injection cascode transistor 202 and a select cascode transistor 204. Both the injection cascode transistor 202 and the select cascode transistor 204 have their gates connected to ground.

As illustrated, the source of the injection transistor 112 is connected to the input node 114 of the network 200. The photo-diode 110 is also connected to the input node 114 and provides a photo-current to input node 114. The injection transistor 112 has its gate connected to a bias voltage Vbias that keeps the photo-diode 110 reversed biased.

The drain of the injection transistor 112 is connected to the source of the injection cascode transistor 202. The drain of the injection cascode transistor 202 is connected to an integration node 210. The integration capacitor 115 is connected between the integration node 210 and a pump signal 212. The pump signal 212 can be implemented as a switch (e.g., a PMOS) transistor in one embodiment that connects to either a supply voltage (Vsupply) or to ground. Thus, it can provide one of two voltages, Vsupply or 0. Vsupply and Vdiode are the same in one embodiment. Vsupply can be about 3.3 volts in one embodiment.

The integration node 210 is connected to the column line through two serially connected transistors, select cascode transistor 204 and select transistor 125. Like before, after an integration time, the select transistor 125 couples the integration node to the column line 118 and allows the charge stored thereon to be read out by CTIA 120.

After readout, the network 200 can be reset. In embodiments herein, such reset can be performed as follows.

During the reset, the pump signal 212 is connected to or otherwise made to be at about the same level as the high supply voltage of the network 200. In one embodiment, the value is the same or similar to Vdiode and can be about 3.3V.

First, the select transistor 125 is enabled while the column line 118 is forced to ground. This resets the integration node 210 to roughly 1V due to the thresholds of the select cascode transistor 204 and select transistor 125. Of course, the value could be different based on the transistors.

Second, the pump signal is then brought from the high level to about ground. This drop will cause the voltage at integration node 210 to drop by nearly 3.3V from the ~1V reset level to −2.3V. This new negative value his is the starting voltage for the integration and it is able to integrate almost to the supply for nearly 5.6V of effective voltage swing.

Such an operation may achieve a 60% higher signal-to-noise than an equivalent non-pumped pixel.

The cascode transistors, injection cascode transistor 202 and the select cascode transistor 204, are added in series with the injection transistor 112 and select transistor 125, respectively, to prevent excessive Vds across them when the integration node 210 takes on a negative value. While shown in FIG. 2, in one embodiment, they are optional and can left out.

For sake of simplicity on description, the integration capacitor 115 can be described as having a first side and a second side. The first side is connected to the integration node 210 and the second side is connected to the pump signal 212. Or course, the connection need not be direct as shown and other elements could be connected either between or in parallel with the pump signal 212 and the second side of the integration capacitor 115.

Figure 3:
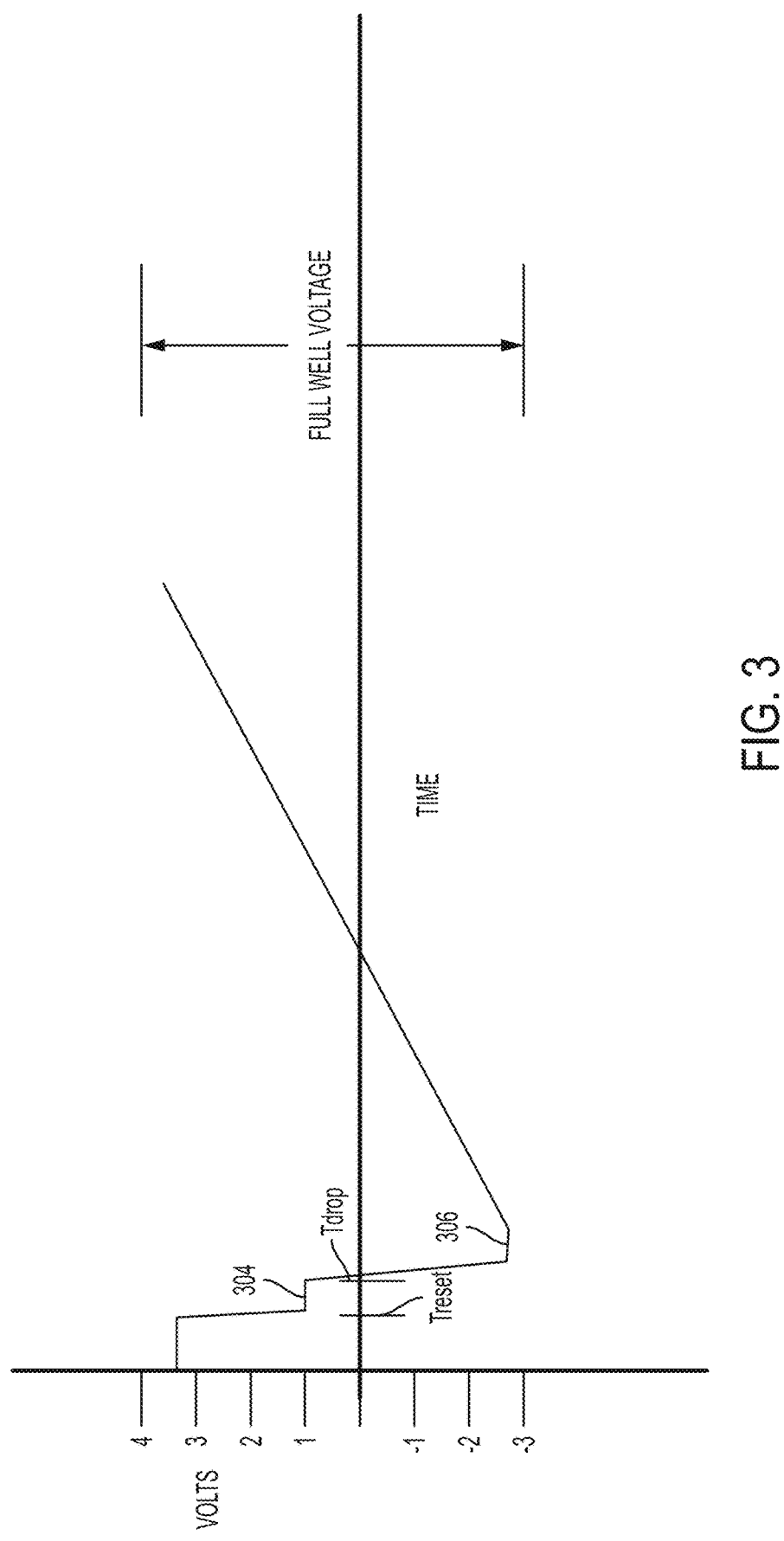
FIG. 3 is graph showing voltage versus time at an integration node of the circuit shown in in FIG. 2.

With reference to both FIG. 2 and FIG. 3, an example of the voltage 302 at the integration node 210 is shown in FIG. 3. It shall be understood that the CTIA 120 has already read out the accumulated charge on the integration capacitor 115. In this example, the voltage is shown as being at the full well potential of 3.3V before a reset. That is because the pump signal 212 is the same as the supply voltage that, in this example, is 3.3V. However, different values could be used.

When the reset occurs at time Treset, the voltage 302 falls to about 1V (e.g. to the voltage drop across both the select cascode transistor 204 and the select transistor 125). As shown, just for clarity, the may dwell at this level for a dwell time 304 but that is not required. At this time, the voltage on the second side of the capacitor is 3.3V.

After Treset, the voltage provided by the pump signal 212 is dropped to about zero volts at a drop time Tdrop. Tdrop is slightly after Treset in one embodiment. The change in the pump signal value will cause the voltage at the integration node 210 to fall by about 3.3 volts to, for example, −2.3 volts. The integration capacitor 115 can then store charge from −2.3 to 3.3 volts for a full well voltage of 5.6 volts. As shown, the storage starts after a second optional dwell time 306.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the disclosure herein or any claims which follow. These claims should be construed to maintain the proper protection for the invention first described.

The invention claimed is:

1. An integration network for connection to a photo-current source, the network comprising:
   an input;
   an output;
   a pump voltage source that provides at least two discrete voltage levels including a high voltage level and a low voltage level;
   an injection transistor coupled the input;
   a select transistor coupled to the output; and
   an integration capacitor coupled between the injection transistor and the pump voltage source, the integration capacitor having a first side and second side, the first side defining an integration node and being coupled to the output through the select transistor and the second side being coupled to the pump voltage source;
   wherein during a reset the integration capacitor is connected to the output through select transistor while the pump voltage source is at the high voltage level, and
   wherein, after the reset, the pump voltage source is at the low level voltage and the integration capacitor is disconnected from the output such that a voltage at the integration node is at a negative value.

2. The network of claim 1, further comprising:
   an injection cascode transistor coupled between the injection transistor and the integration node; and
   a select cascode transistor coupled in series with the select transistor and between the integration node and the output.

3. The network of claim 2, wherein the select cascode transistor is coupled between the integration node and the select transistor.

4. The network of claim 2, wherein a gate of the injection cascode transistor is connected to ground and a gate of the select cascode transistor is connected to ground.

5. The network of claim 2, wherein the injection transistor, the injection cascode transistor, the select transistor and the select cascode transistor are PMOS transistors.

6. The network of claim 1, in combination with a photodiode connected between the input and a diode voltage (Vdiode).

7. The network of claim 6, wherein the high level is equal to Vdiode.

8. A pixel comprising:
   a photo-current source;
   a readout circuit;
   an integration network comprising:
   an input connected to the photo-current source;
   an output connected to the readout circuit;
   a pump voltage source that provides at least two discrete voltage levels including a high voltage level and a low voltage level;
   an injection transistor coupled to the input;
   a select transistor coupled to the output; and
   an integration capacitor coupled between the injection transistor and the pump voltage source, the integration capacitor having a first side and second side, the first side defining an integration node and being coupled to the output through the select transistor and the second side being coupled to the pump voltage source;
   wherein during a reset the integration capacitor is connected to the output through the select transistor while the pump voltage source is at the high voltage level, and
   wherein, after the reset, the pump voltage source is at the low level voltage and the integration capacitor is disconnected from the output such that a voltage at the integration node is at a negative value.

9. The pixel of claim 8, wherein the readout circuit is a capacitive transimpedance amplifier (CTIA) readout circuit.

10. The pixel of claim 8, wherein the network further includes:
an injection cascode transistor coupled between the injection transistor and the integration node; and
a select cascode transistor coupled in series with the select transistor and between the integration node and the output.

11. The pixel of claim 10, wherein the select cascode transistor is coupled between the integration node and the select transistor.

12. The pixel of claim 10, wherein a gate of the injection cascode transistor is connected to ground and a gate of the select cascode transistor is connected to ground.

13. The pixel of claim 10, wherein the injection transistor, the injection cascode transistor, the select transistor and the select cascode transistor are PMOS transistors.

14. The pixel of claim 8, wherein the photo-current source is a photo-diode connected between the input and a diode voltage (Vdiode) and wherein the high voltage level is equal to Vdiode.

15. A method of operating a pixel, the pixel comprising an integration capacitor coupled between a system voltage and a pump voltage source, the capacitor having a first side connected to a photo-current source and a second side connected to the pump voltage source, the method comprising:
storing charge from the photo-current source the integration capacitor;
reading out the integration capacitor;
resetting the integration capacitor by connecting the first side of the capacitor to a column line through a select transistor;
while resetting, setting the pump voltage source to the system voltage; and
after resetting, setting the pump voltage to ground to create a negative voltage between the integration capacitor and column line.

16. The method of claim 15, wherein resetting includes connecting the integration capacitor to the column line select cascode transistor coupled in series with the select transistor and between the integration node and the output.

17. The method of claim 16, further comprising:
after resetting, connecting the integration capacitor to the photo-current source through an injection cascode transistor coupled in series with an injection transistor, wherein the injection transistor is coupled to the photocurrent source.

18. The method claim 17, wherein the injection transistor, the injection cascode transistor, the select transistor and the select cascode transistor are PMOS transistors.

* * * * *